United States Patent
Gu et al.

(10) Patent No.: US 12,132,080 B2
(45) Date of Patent: Oct. 29, 2024

(54) FINFET WITH SHORTER FIN HEIGHT IN DRAIN REGION THAN SOURCE REGION AND RELATED METHOD

(71) Applicant: GlobalFoundries U.S. Inc., Malta, NY (US)

(72) Inventors: Man Gu, Malta, NY (US); Wenjun Li, Malta, NY (US)

(73) Assignee: GLOBALFOUNDRIES U.S. Inc., Malta, NY (US)

(*) Notice: Subject to any disclaimer, the term of this patent is extended or adjusted under 35 U.S.C. 154(b) by 469 days.

(21) Appl. No.: 17/452,651

(22) Filed: Oct. 28, 2021

(65) Prior Publication Data
US 2022/0052158 A1 Feb. 17, 2022

Related U.S. Application Data

(62) Division of application No. 16/936,524, filed on Jul. 23, 2020, now Pat. No. 11,211,453.

(51) Int. Cl.
| | |
|---|---|
| *H01L 29/78* | (2006.01) |
| *H01L 29/06* | (2006.01) |
| *H01L 29/417* | (2006.01) |
| *H01L 29/66* | (2006.01) |

(52) U.S. Cl.
CPC .... *H01L 29/0696* (2013.01); *H01L 29/41791* (2013.01); *H01L 29/66795* (2013.01); *H01L 29/7816* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 6,876,035 B2 | 4/2005 | Abadeer et al. | |
| 6,921,963 B2 | 7/2005 | Krivokapic et al. | |
| 7,612,405 B2 * | 11/2009 | Yu | H01L 29/785 |
| | | | 257/E29.267 |

(Continued)

FOREIGN PATENT DOCUMENTS

| | | |
|---|---|---|
| CN | 103325831 A | 9/2013 |
| CN | 107045980 A | 8/2017 |

(Continued)

OTHER PUBLICATIONS

U.S. Appl. No. 16/936,524, Notice of Allowance dated Sep. 21, 2021, 7 pages.

(Continued)

*Primary Examiner* — Ali Naraghi
(74) *Attorney, Agent, or Firm* — Anthony Canale; Hoffman Warnick LLC

(57) ABSTRACT

A FinFET includes a semiconductor fin, and a source region and a drain region in the same semiconductor fin. The drain region has a first fin height above a trench isolation; and the source region has a second fin height above the trench isolation. The first fin height is less than the second fin height. The FinFET may be used, for example, in a scaled laterally diffused metal-oxide semiconductor (LDMOS) application, and exhibits reduced parasitic capacitance for improved radio frequency (RF) performance. A drain extension region may have the first fin height, and a channel region may have the second fin height. A method of making the FinFET is also disclosed.

15 Claims, 7 Drawing Sheets

(56) References Cited

U.S. PATENT DOCUMENTS

| | | | |
|---|---|---|---|
| 8,748,993 B2* | 6/2014 | Lee | H01L 21/823431 |
| | | | 257/314 |
| 8,940,602 B2 | 1/2015 | Basker et al. | |
| 9,082,851 B2 | 7/2015 | Ramachandran et al. | |
| 10,049,942 B2* | 8/2018 | Chou | H01L 29/785 |
| 10,164,006 B1 | 12/2018 | Ciavatti et al. | |
| 10,199,494 B2 | 2/2019 | Zhou | |
| 2009/0020806 A1* | 1/2009 | Anderson | H01L 29/78 |
| | | | 257/E21.409 |
| 2009/0057780 A1* | 3/2009 | Wong | H01L 27/1211 |
| | | | 257/E21.409 |
| 2014/0035043 A1* | 2/2014 | Lee | H01L 29/785 |
| | | | 257/365 |
| 2015/0035053 A1 | 2/2015 | Singh | |
| 2015/0200252 A1 | 7/2015 | Ching et al. | |
| 2016/0027775 A1 | 1/2016 | Akarvardar et al. | |
| 2016/0163850 A1 | 6/2016 | Liu et al. | |
| 2016/0204106 A1 | 7/2016 | You et al. | |
| 2016/0225896 A1 | 8/2016 | Yoo et al. | |
| 2017/0229570 A1 | 8/2017 | Cheng et al. | |
| 2018/0108755 A1 | 4/2018 | Liu et al. | |
| 2019/0140054 A1 | 5/2019 | Dewey et al. | |
| 2020/0075764 A1 | 3/2020 | Jang et al. | |
| 2020/0144124 A1 | 5/2020 | Bi et al. | |

FOREIGN PATENT DOCUMENTS

| | | |
|---|---|---|
| CN | 107799591 A | 3/2018 |
| WO | 2015195116 A1 | 12/2015 |

OTHER PUBLICATIONS

Non Final Office Action mailed Aug. 10, 2022 for U.S. Appl. No. 16/919,225, filed Jul. 2, 2020; pp. 47.

Notice of Allowance and Fee(s) Due mailed Oct. 3, 2022 for U.S. Appl. No. 16/919,225, filed Jul. 2, 2020; pp. 11.

* cited by examiner

FINFET WITH SHORTER FIN HEIGHT IN DRAIN REGION THAN SOURCE REGION AND RELATED METHOD

TECHNICAL FIELD

The present disclosure relates to power amplifier devices, and more specifically, to a fin-type field effect transistor (FinFET) having a semiconductor fin with a drain region having a shorter fin height above a trench isolation than a source region in the same fin. The shorter fin height in the drain region and a drain extension region reduces gate-drain parasitic capacitance.

BACKGROUND

Radio frequency (RF) devices employ laterally diffused metal-oxide semiconductor (LDMOS) FinFETs. LDMOS devices include, within a semiconductor fin, a p-well with a source region therein and an n-well with a drain region therein. A gate extends over the p-well and n-well with the channel in the p-well and a relatively long drain extension region in the n-well. The longer drain extension region reduces gate-drain capacitance and improves RF gain. The longer drain extension region can be created in LDMOS devices in a number of different forms. For example, LDMOS shallow trench isolation (LDMOS-STI) devices include a shallow trench isolation (STI) within the drain extension region in the n-well of the device, and LDMOS dummy gate (LDMOS-DP) devices have the n-well without the STI, but include a second, floating (dummy) gate over the drain extension region in the n-well of the device.

LDMOS FinFETs are employed, for example, as wireless network power amplifiers with 3.3-5 Volt power. One challenge with these devices is that the longer drain extension region introduces a higher on-resistance ($R_{on}$), which degrades the power efficiency for power amplifier applications. In order to address this situation, scaled LDMOS FinFETs devoid of the STI or dummy gate are preferred because they significantly reduce $R_{on}$ by using a shorter drain extension region. However, scaled LDMOS FinFETs also disadvantageously increase gate-drain parasitic capacitance ($C_{gd}$) and degrade RF gain.

SUMMARY

An aspect of the disclosure includes a laterally diffused metal-oxide semiconductor (LDMOS) fin-type field effect transistor (FinFET), comprising: a semiconductor fin having a trench isolation adjacent thereto; a drain region in the semiconductor fin, the drain region having a first fin height above the trench isolation; a source region in the same semiconductor fin as the drain region, the source region having a second fin height above the trench isolation; a drain extension region in the same semiconductor fin as the source region and the drain region, the drain extension region having the first fin height above the trench isolation; a gate extending across the semiconductor fin; and a channel region under the gate in the same semiconductor fin as the source region and the drain region, the channel region positioned between the drain extension region and the source region, the channel region having the second fin height above the trench isolation.

Another aspect of the disclosure includes a laterally diffused metal-oxide semiconductor (LDMOS) fin-type field effect transistor (FinFET), comprising: a semiconductor fin having a trench isolation adjacent thereto; a drain region in the semiconductor fin, the drain region having a first fin height above the trench isolation; a source region in the same semiconductor fin as the drain region, the source region having a second fin height above the trench isolation; a drain extension region in the same semiconductor fin as the source region and the drain region, the drain extension region having the first fin height above the trench isolation; a gate extending across the semiconductor fin; and a channel region under the gate in the same semiconductor fin as the source region and the drain region, the channel region positioned between the drain extension region and the source region, the channel region having the second fin height above the trench isolation, wherein the first fin height is less than the second fin height.

Another aspect of the disclosure is related to a method, comprising: forming a trench isolation adjacent a semiconductor fin to create a first fin height above the trench isolation in a first region of the semiconductor fin and a second fin height above the trench isolation in a second region of the semiconductor fin, wherein the first fin height is less than the second fin height; and forming a fin-type field effect transistor (FinFET) using the semiconductor fin with a drain region in the first region and a source region in the second region.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
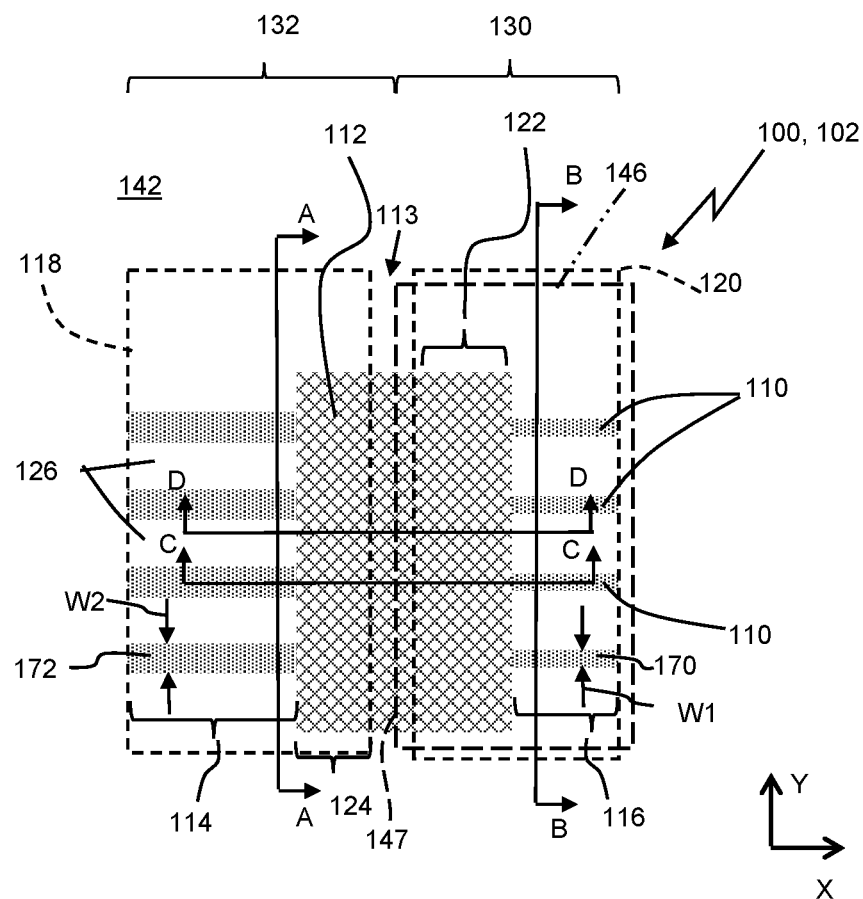
FIG. 1 shows a schematic plan view of a general layout of a FinFET for the purposes of describing embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a FinFET that includes a semiconductor fin, and a source region and a drain region in the semiconductor fin. A gate extends across the semiconductor fin. Capacitive coupling between the gate and drain region epitaxy ($C_{pc\text{-}epi}$) contributes significantly to gate-drain parasitic capacitance ($C_{gd}$), and is a unique parasitic capacitance component to FinFETs. Embodiments of the disclosure provide the drain region with a first fin height above a trench isolation; and the source region with a second fin height above the trench isolation. The first fin height is less than the second fin height. The shorter fin height in, for example, the drain region and the drain extension region of a scaled LDMOS FinFET, significantly reduces gate-drain parasitic capacitance ($C_{gd}$). Thus, the FinFET employed in, for example, a scaled LDMOS application for power amplifier applications, exhibits reduced parasitic capacitance for improved radio frequency (RF) performance. A channel region of the LDMOS FinFET may also have the second fin height.

FIGS. 1-12 are illustrations of a method of forming a FinFET 100 (FIGS. 1, 11-12) and a LDMOS FinFET 102 (FIGS. 1, 11-12), according to various embodiments of the disclosure. For purposes of description, FinFET 100 (FIGS. 1, 11-12) may be implemented as a scaled LDMOS FinFET 102 (FIGS. 1, 11-12), i.e., without an STI in the n-well or a dummy gate. It is emphasized that the teachings of the disclosure can also be applied in other types of MOS devices.

FIG. 1 shows a schematic plan view of a general layout of FinFET 100 for the purposes of describing embodiments of the disclosure. FIG. 1 includes a set of view lines A-A, B-B, C-C and D-D that will be referenced for purposes of describing the disclosure. FIG. 1 shows FinFET 100 including a semiconductor fin 110 (e.g., four fins) extending across the page, and a gate 112 extending across semiconductor fin(s) 110. While four semiconductor fins 110 are shown, it is understood that any number of trenches 144 (FIG. 2A) can be created to form any number of semiconductor fins 110. In FIG. 1, view line A-A is across semiconductor fin(s) 110 at a source region 114 (noted by bracket indicating a length of fin(s) 110) where a taller fin height (not shown in FIG. 1) will be provided. View line B-B is across semiconductor fin(s) 110 at a drain region 116 (noted by bracket indicating a length of fin(s) 110) where a shorter fin height (not shown in FIG. 1) will be provided. Where FinFET 100 is used as an LDMOS device, it may include a p-well 118 (dashed box) in one longitudinal extent of semiconductor fin(s) 110, and an n-well 120 (dashed box) in another longitudinal extent of semiconductor fin(s) 110. A drain extension region 122 is under gate 112 in n-well 120. A channel region 124 is under gate 112 and in p-well 118. View line C-C is a cross-sectional view along a selected semiconductor fin(s) 110, view line D-D is a cross-sectional view along a trench isolation 126 between adjacent semiconductor fins 110. For any particular stage of the method, a drawing number indicates the particular stage. A drawing with the 'A' notation is across view line A-A, a drawing with the 'B' notation is across view line B-B. Other drawings will make reference to the other view lines (C-C, D-D), where appropriate.

FIGS. 2A-B to 3A-B show cross-sectional views of forming a trench isolation 126 adjacent semiconductor fin(s) 110 to create: a first fin height FH1 (FIGS. 2A-B, 3B) above trench isolation 126 in a first region 130 (e.g., drain region 116) of semiconductor fin(s) 110, and a second fin height FH2 (FIG. 3A) above trench isolation 126 in a second region 132 (e.g., source region 114) of semiconductor fin(s) 110.

Figure 2A:
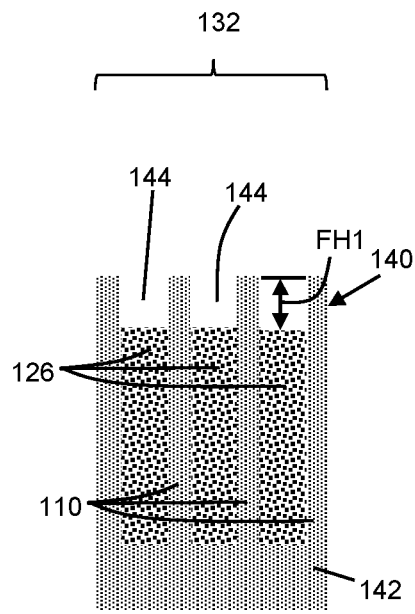
FIGS. 2A-2B show cross-sectional views along line A-A and B-B in FIG. 1, respectively, of recessing a trench isolation, according to embodiments of the disclosure.
Figure 2B:
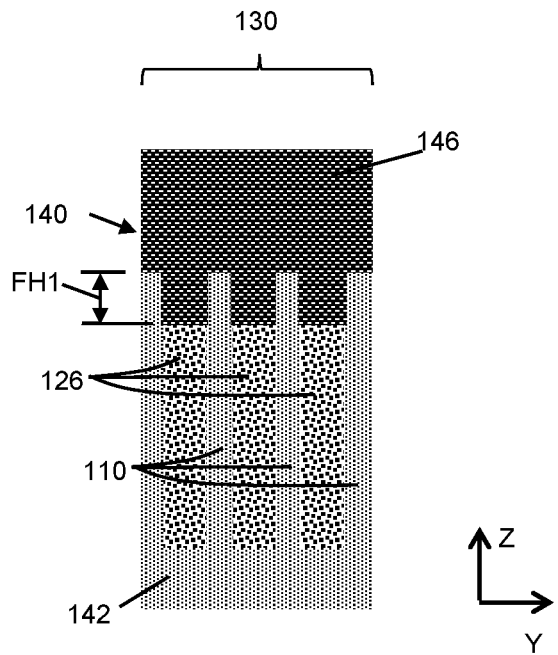

FIGS. 2A-B show cross-sectional views of a preliminary structure 140. At this stage, semiconductor fin(s) 110 have been formed over a semiconductor substrate 142 using any now known or later developed technique. Semiconductor fin(s) 110 and substrate 142 may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or the entire semiconductor fin and/or substrate may be strained.

Although not shown in FIGS. 2A-B and FIGS. 3A-B, at this stage n-well 120 (FIG. 1) and p-well 118 (FIG. 1) have been formed in semiconductor fin(s) 110. P-well 118 may include a p-type dopant, which may include but is not limited to: boron (B), indium (In) and gallium (Ga); and n-well 120 may include an n-type dopant, which may include but is not limited to: phosphorous (P), arsenic (As), or antimony (Sb). Wells 118, 120 may be formed using any now known or later developed semiconductor doping technique, e.g., ion implantation and/or in-situ doping.

Trench isolation 126 is formed between adjacent semiconductor fin(s) 110 to electrically separate adjacent semiconductor fins 110. Trench isolations 126 may include any form of trench isolation, such as a shallow trench isolation (STI) between semiconductor fins 110. Trench isolations 126 may include any now known or later developed interlayer dielectric. Suitable dielectric materials include but are not limited to: silicon dioxide; carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning). In one non-limiting example, trench isolation 126 formation may include performing an in-situ steam generation (ISSG) oxidation, polysilicon liner deposition, flowable chemical vapor deposition (FCVD) of dielectric (in trenches 144 (FIG. 2A) between semiconductor fins 110), and an anneal to enhance the dielectric material quality. Other dielectric formation processes may be used.

FIGS. 2A-2B also show forming trench isolation 126 adjacent semiconductor fin(s) 110 to create first fin height FH1 above trench isolation 126 in both first and second regions 130, 132 of semiconductor fin(s) 110. As shown in FIG. 1, each region 130, 132 includes a longitudinal extent of semiconductor fin(s) 110. Any desired first fin height FH1 for first region 130, e.g., drain region 116 or drain extension region 122, may be created by controlling the etching employed. As noted, first fin height FH1 will eventually be the shorter fin height between regions 130, 132 in each respective semiconductor fin 110. The recessing may include etching the dielectric of trench isolation 126.

Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases that approach the wafer approximately from one direction, and therefore this process is highly anisotropic. Reactive-ion etching (RIE) operates under conditions intermediate between sputter and plasma etching and may be used to produce deep, narrow features. The recessing may include using any appropriate etching chemistry for the dielectric of trench isolation 126, e.g., a RIE.

Referring to FIG. 2B, a mask 146 is formed over first region 130 in which shorter first fin height FH1 (FIG. 3B) above trench isolation 126 is desired. Mask 146 may include any now known or later developed mask material layer(s) such as spin on hardmask (SOH). Masking material may be formed over the entire wafer, and patterned to cover first region 130 in which shorter fin height FH1 (FIG. 3B) above trench isolation 126 is ultimately desired, and expose second region 132 in which taller fin height FH2 (FIG. 3A) is desired. In one embodiment, an edge 147 (FIG. 1) of mask 146 defines a transition between first fin height FH1 and second fin height FH2. Edge 147 (FIG. 1) is positioned over gap 113 between p-well 118 and n-well 120 in semiconductor fin(s) 110. The transition, as will be described further herein, creates a step 148 (FIGS. 3B and 4) in trench isolation 126 adjacent semiconductor fin(s) 110. Although step 148 is shown as vertical, it is understood that some angling and/or undulations of the surface may be possible.

Figure 3A:
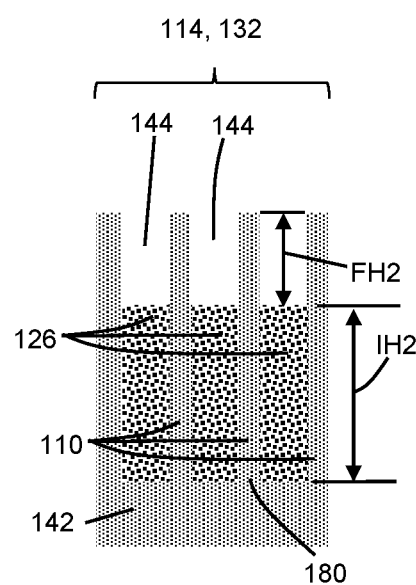
FIGS. 3A-3B show cross-sectional views along line A-A and B-B in FIG. 1, respectively, of another recessing of the trench isolation, according to embodiments of the disclosure.
Figure 3B:
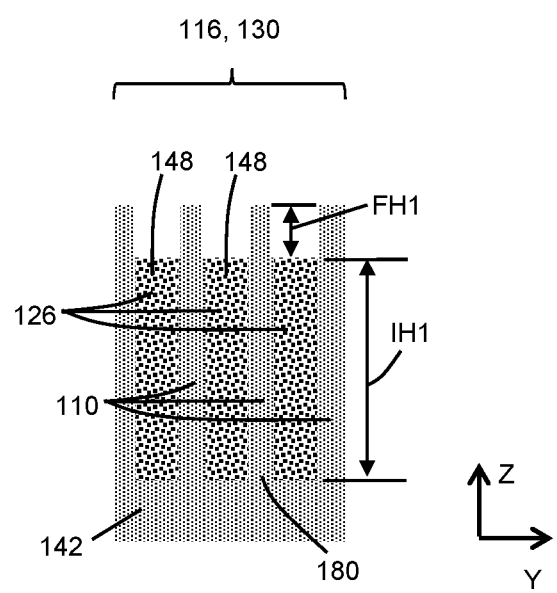

FIGS. 3A-3B show cross-sectional views of the results of further recessing of trench isolation 126 adjacent semiconductor fin(s) 110 to create second fin height FH2 (FIG. 3A) above trench isolation 126 in second region 132 (e.g., source region 114 and channel region 124) of semiconductor fin(s) 110. The recessing may include using any appropriate etching chemistry for the dielectric of trench isolation 126, e.g., a RIE. As illustrated, the recessing further deepens trenches 144 by removing the dielectric of trench isolations 126. Any desired depth for second region 132, e.g., source region 114, may be created by controlling the etching employed. For example, first fin height FH1 may be between 40% and 60% of second fin height FH2, and more particularly, may be approximately 50% of second fin height FH2. In most cases, the taller, second fin height FH2 would be that used in normal circumstances for the FinFET of any particular technology node. In FIG. 3B, mask 146 has been removed from first region 130, resulting in first fin height FH1 above trench isolation 126 in first region 130 of semiconductor fin(s) 110 being retained. Mask 146 may be removed using any appropriate process, e.g., an ashing process.

Figure 4:
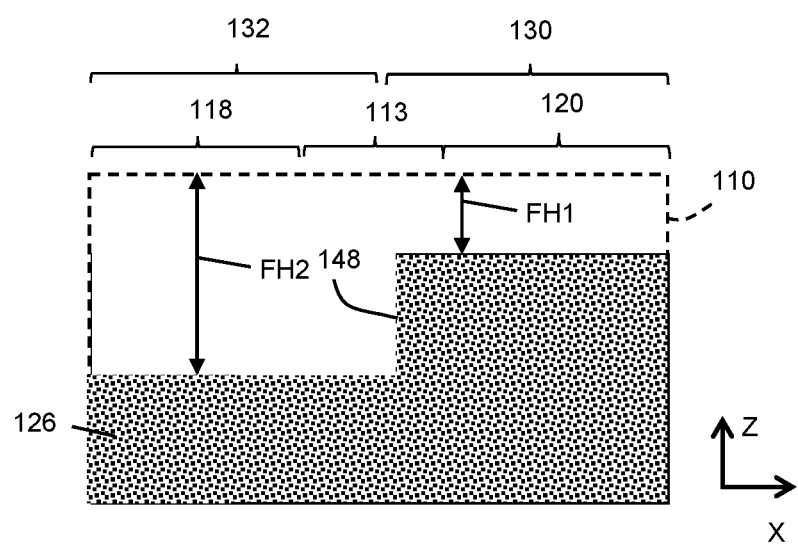
FIG. 4 shows a cross-sectional view along line D-D in FIG. 1 of a step in the trench isolation adjacent the semiconductor fin, according to embodiments of the disclosure.

To further illustrate the transition created within trench isolation 126, FIG. 4 shows a schematic cross-sectional view along line D-D in FIG. 1 of trench isolation 126 with an adjacent semiconductor fin 110 superimposed therewith. The brackets denote the locations of p-well 118, n-well 120, and gap 113 between the wells. Although not shown for clarity, source region 114 and channel region 124 (FIG. 1) would be in part of p-well 118, and drain region 116 and drain extension region 122 (FIG. 1) would be in n-well 120, in semiconductor fin(s) 110. As illustrated, a transition between first fin height FH1 and second fin height FH2 is positioned in gap 113 between p-well 118 and n-well 120 in semiconductor fin(s) 110. The transition creates step 148 in trench isolation 126 adjacent semiconductor fin(s) 110.

FIGS. 5-10 show cross-sectional views of forming FinFET 100 (FIGS. 11-12) using semiconductor fin(s) 110 with drain region 116 in first region 130 and source region 114 in second region 132. FinFET 100 (FIGS. 11-12) may be formed using any now known or later developed semiconductor processing techniques. Only one non-limiting example of the processing in the form of a replacement metal gate (RMG) process will be described herein, for brevity. The RMG process may include any now known or later developed RMG techniques, and therefore will not be described in great detail herein. The RMG process may include, for example, forming dummy gate(s) 150 over semiconductor fin(s) 110. It is understood that dummy gates 150 are placed to reserve a location for an eventual metal gate, and to allow for processing that would otherwise damage a metal gate.

Figure 5:
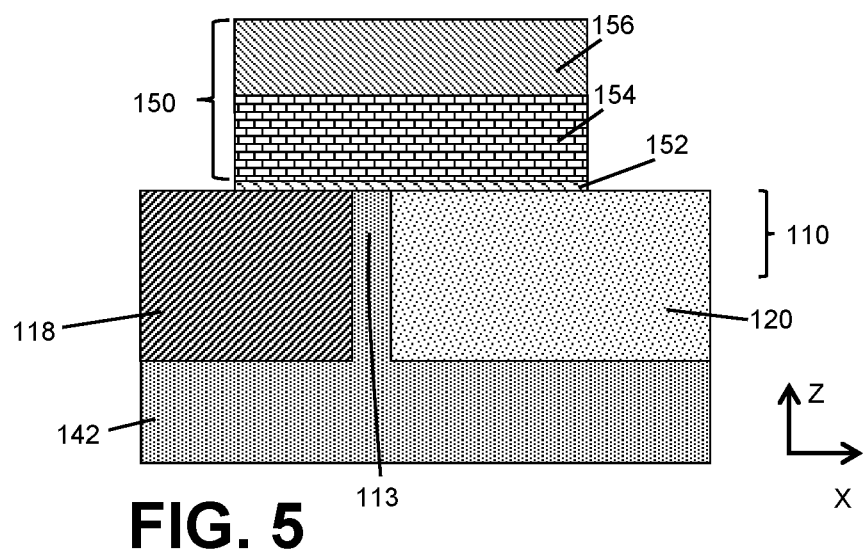
FIG. 5 shows a cross-sectional view along line C-C in FIG. 1 of forming a dummy gate, according to embodiments of the disclosure.
Figure 6:
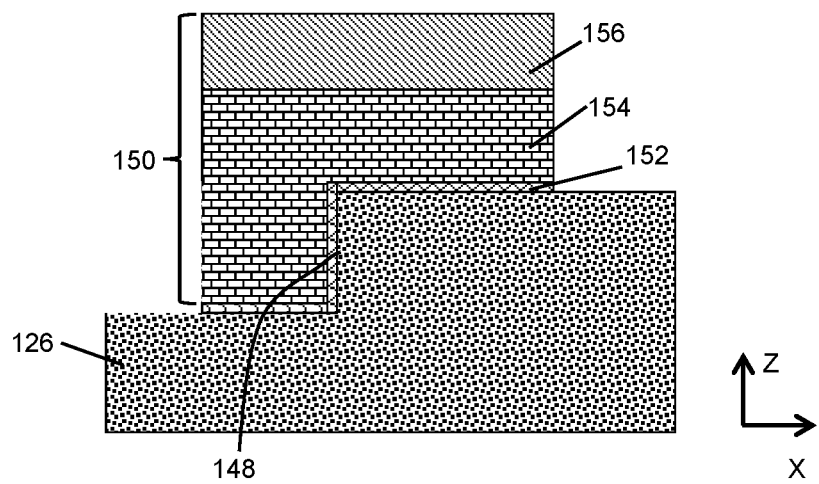
FIG. 6 shows a cross-sectional view along line D-D in FIG. 1 of forming the dummy gate, according to embodiments of the disclosure.

FIG. 5 shows a cross-sectional view along line C-C in FIG. 1 of dummy gate 150 over a portion of p-well 118, gap 113 and a portion of n-well 120; and FIG. 6 shows a cross-sectional view along line D-D in FIG. 1 of dummy gate 150 over step 148 in trench isolation 126. A gate dielectric layer 152 may be formed over semiconductor fin(s) 110. Gate dielectric layer 152 may include, for example, silicon oxide. Dummy gate(s) 150 may include a sacrificial material block 154 such as polysilicon or amorphous silicon, and a cap layer 156, e.g., silicon nitride, over sacrificial material block 154. Dummy gates 150 may be shaped using any now known or later developed patterning process.

Figure 7:
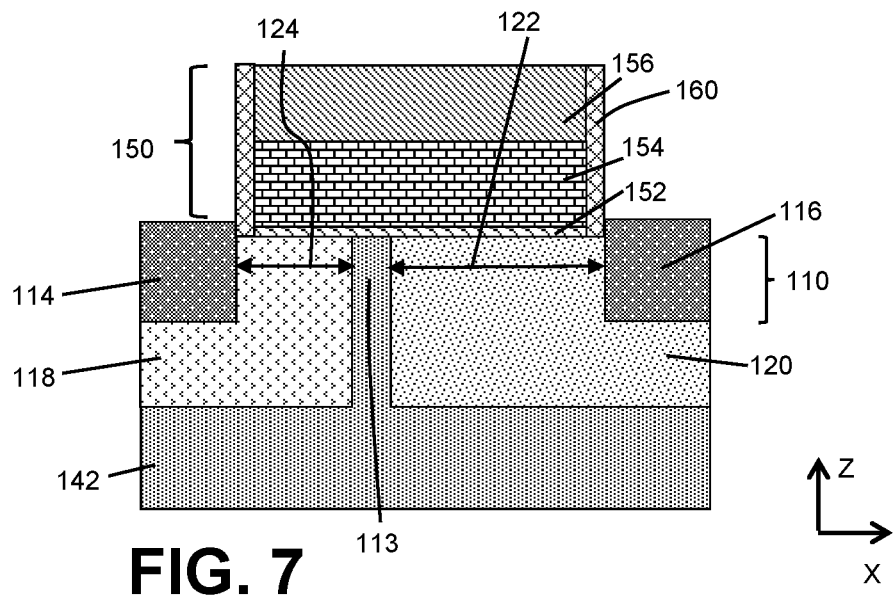
FIG. 7 shows a cross-sectional view along line C-C in FIG. 1 of forming source/drain regions, according to embodiments of the disclosure.
Figure 8:
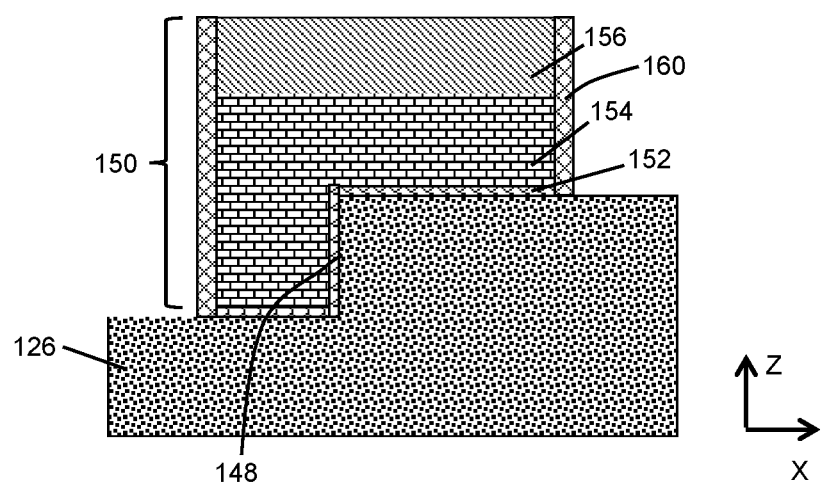
FIG. 8 shows a cross-sectional view along line D-D in FIG. 1 of forming source/drain regions, according to embodiments of the disclosure.
Figure 9:
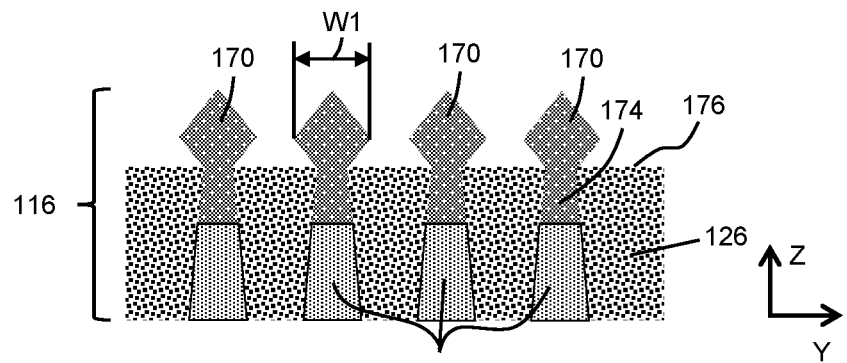
FIG. 9 shows a cross-sectional view of a drain region epitaxial portion, according to embodiments of the disclosure.
Figure 10:
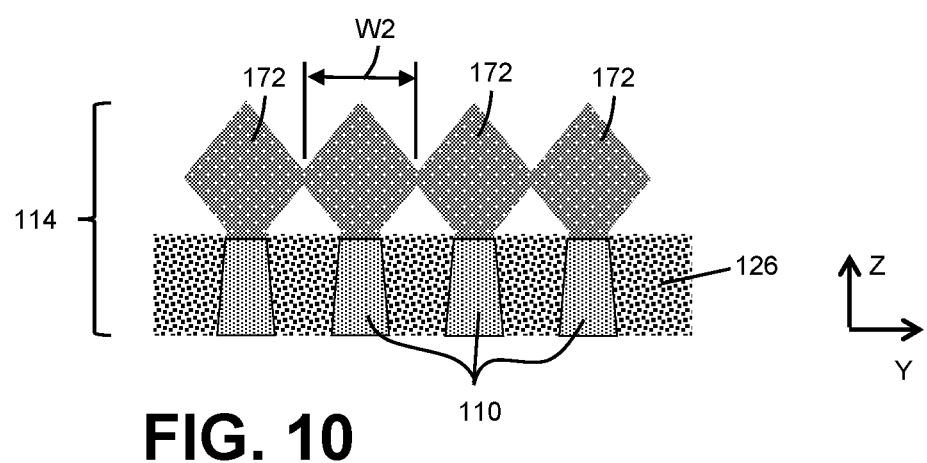
FIG. 10 shows a cross-sectional view of a source region epitaxial portion, according to embodiments of the disclosure.

FIGS. 7-10 show cross-sectional views of forming source/drain regions 114, 116. FIG. 7 shows a cross-sectional view along line C-C in FIG. 1 of forming source/drain regions 114, 116 in semiconductor fin(s) 110; and FIG. 8 shows a cross-sectional view along line D-D in FIG. 1 of forming source/drain regions 114, 116 in semiconductor fin(s) 110. FIG. 9 shows a cross-sectional view along line B-B in FIG. 1 of forming a drain region epitaxial portion 170 above trench isolation 126 in semiconductor fin(s) 110; and FIG. 10 shows a cross-sectional view along line A-A in FIG. 1 of forming a source region epitaxial portion 172 in semiconductor fin(s) 110. Drain region 116 is formed with drain region epitaxial portion 170 above trench isolation 126, and source region 114 is formed with source region epitaxial portion 172 above trench isolation 126. At this stage, dummy gates 150 have been trimmed to a desired shape and a spacer 160, e.g., silicon nitride, has been added. Source/drain regions 114, 116 may be formed using any now known or later developed semiconductor doping technique. For example, source/drain regions 114, 116 may be formed by mask-directed doping by ion implantation followed by doping, e.g., an anneal to drive in the dopants. Source/drain regions 114, 116 may be doped with an n-type dopant, e.g., with a higher dopant concentration than n-well 120. As these implanting steps are well known in the art, no additional details are provided.

In addition, source/drain regions 114, 116 may be formed by epitaxial growth on semiconductor fin(s) 110. The terms "epitaxial growth" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. Here, due to the different fin heights FH1, FH2 (FIGS. 3A-B), as shown in FIGS. 1, 9 and 10, drain region epitaxial portion 170 is formed with a first width W1, and source region epitaxial portion 172 is formed with a second width W2. As illustrated, because second fin height FH2 (FIG. 3A) is larger, second width W2 of source region epitaxial portion 172 is wider than first width W1 of drain region epitaxial portion 170, which has the smaller first fin height FH1 (FIG. 3B). Similarly, source region epitaxial region 172 may also be taller than drain region epitaxial portion 170. As illustrated in FIG. 9, drain region 116 may include another drain region epitaxial portion 174 extending below an upper surface 176 of trench isolation 126.

Figure 11:
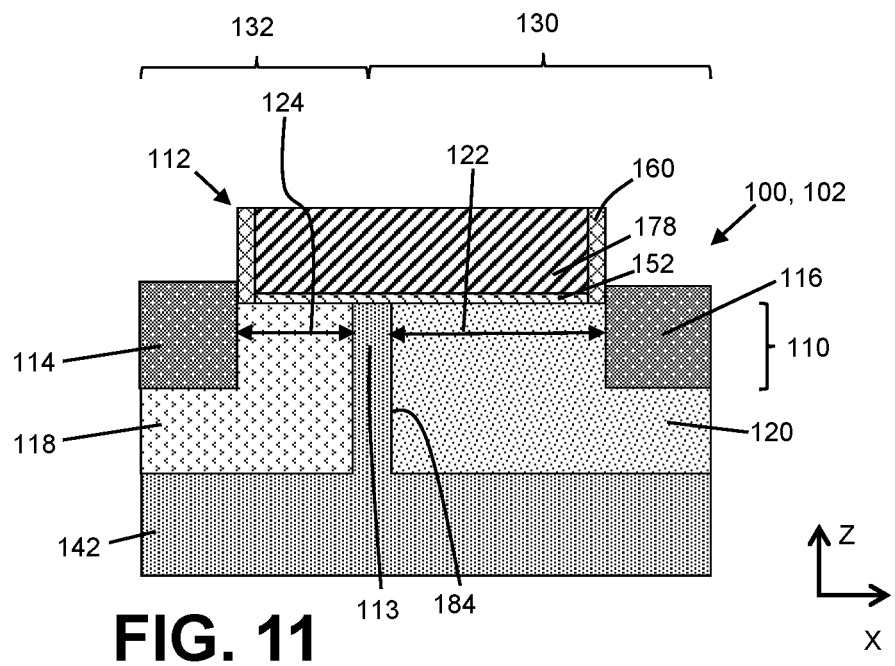
FIG. 11 shows a cross-sectional view along line C-C in FIG. 1 of a FinFET and a scaled LDMOS FinFET, according to embodiments of the disclosure.
Figure 12:
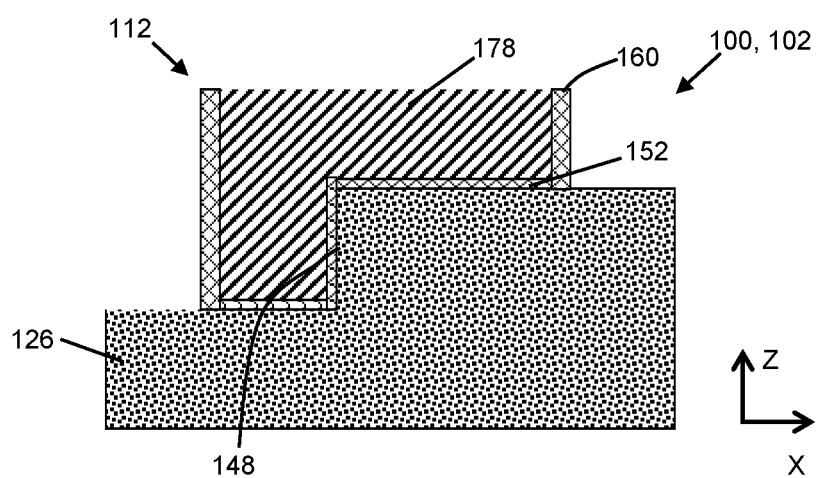
FIG. 12 shows a cross-sectional view along line D-D in FIG. 1 of a FinFET and a scaled LDMOS FinFET, according to embodiments of the disclosure.

Referring to FIGS. 11 and 12, the RMG process continues. Dummy gate(s) 150 (FIGS. 7-8) may be removed using any now known or later developed process, e.g., any "dummy gate pull" technique. In one example, dummy gate(s) 150 are etched away. In this case, dummy gate(s) 150 may be removed, for example, by RIE. Gates 112, and more particularly metal gates, may be formed in the location vacated by dummy gates 150. Gates 112 may include gate dielectric layer 152. Gate dielectric layer 152 may also include any now known or later developed high dielectric constant (high-K) material such as but not limited to: metal oxides such as tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). Gates 112 may also include one or more conductive components 178 for providing a gate terminal of a transistor. For example, although not shown for clarity, gates 112 may include a work function metal layer and a gate conductor over the work function metal. The work function metal layer may include various metals depending on whether for an NFET or PFET device, but may include, for example: aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), TiAlC, TiAl, tungsten (W), tungsten nitride (WN), tungsten carbide (WC), polycrystalline silicon (poly-Si), and/or combinations thereof. The gate conductor may include any now known or later developed gate conductor such as copper (Cu). A gate cap (not shown) of, for example, a nitride may also be formed over gate 112.

Forming gate 112 for FinFET 100 also includes forming drain extension region 122 in n-well 120 in first region 130 and adjacent drain region 116. Drain extension region 122 has the shorter first fin height FH1 (FIG. 3B). Drain extension region 122 extends from an edge 184 of n-well 120 to drain region 116. Forming gate 112 for FinFET 100 also includes forming channel region 124 in p-well 118 in second region 132 adjacent source region 114. Channel region 124 thus has the taller, second fin height FH2 (FIG. 3A).

Additional processing may include forming any now known or later developed interconnects in dielectric layers (not shown) over FinFET 100 and LDMOS FinFET 102.

With reference to FIGS. 1, 11 and 12, FinFET 100 according to embodiments of the disclosure will be described. As noted, FinFET 100 may be employed as a laterally diffused metal-oxide semiconductor (LDMOS) FinFET 102, which is also shown in FIGS. 1, 11 and 12. FinFET 100 may include semiconductor fin(s) 110 having trench isolation 126 adjacent thereto. FinFET 100 may also include drain region 116 in semiconductor fin(s) 110 with drain region 116 having first fin height FH1 (FIG. 3B) above trench isolation 126. FinFET 100 also includes source region 114 in the same semiconductor fin(s) 110 as drain region 116 with source region 114 having second fin height FH2 above trench isolation 126. As noted, first fin height FH1 is less than second fin height FH2, resulting in an asymmetric device. First fin height FH1 (FIG. 3B) may be between 40% and 60% of the second fin height FH2, e.g., approximately 50%. FinFET 100 also includes gate 112 extending across semiconductor fin(s) 110.

FinFET 100 may also include drain extension region 122 in n-well 120 in semiconductor fin(s) 110. Drain extension region 122 is in first region 130 and thus has the shorter first fin height FH1 (FIG. 3B). Channel region 124 is under gate 112 in semiconductor fin 110 and between source region 114 and drain extension region 122. Channel region 124 is in second region 132 and thus has second fin height FH2 (FIG. 3A). As noted, channel region 124 is positioned in p-well 118 in semiconductor fin 110, and a transition between first fin height FH1 (FIG. 3B) and second fin height FH2 (FIG. 3A) is positioned in gap 113 (FIGS. 1 and 11) between p-well 118 and n-well 120 in semiconductor fin 110. As shown in FIGS. 9 and 10, respectively, drain region 116 may also include drain region epitaxial portion 170 above trench isolation 126, and source region 114 may include source region epitaxial portion 172 above trench isolation 126. Source region epitaxial region 172 is wider than drain region epitaxial portion 170, i.e., W2>W1. As illustrated in FIG. 9, drain region 116 may include another drain region epitaxial portion 174 extending below upper surface 176 of trench isolation 126. As shown in FIGS. 3A-B, trench isolation 126 has a first isolation height IH1 relative to a bottom 180 of semiconductor fin 110 adjacent drain region 116 in semiconductor fin 110 and a second isolation height IH2 relative to bottom 180 of semiconductor fin 110 adjacent source region 114 in semiconductor fin 110. Due to the varied recessing of trench isolation 126, first isolation height IH1 is greater than second isolation height IH2, which defines step 148 (FIGS. 3B and 4) in trench isolation 126 adjacent semiconductor fin 110. As shown in FIG. 12, gate 112 extends over step 148 in trench isolation 126 adjacent semiconductor fin 110.

Embodiments of the disclosure provide FinFET 100 usable for, among other things, a scaled LDMOS FinFET 102 for RF applications such as power amplifiers. FinFET 100 with the shorter fin height in, for example, drain region 116 and drain extension region 122 of scaled LDMOS FinFET 102, significantly reduces gate-drain parasitic capacitance ($C_{gd}$). Thus, the FinFET exhibits reduced parasitic capacitance for improved radio frequency (RF) performance. In addition, FinFET 100 exhibits improved RF power gain.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A laterally diffused metal-oxide semiconductor (LDMOS) fin-type field effect transistor (FinFET), comprising:
a semiconductor fin having a trench isolation adjacent thereto;
a drain region in the semiconductor fin, the drain region having a first fin height above the trench isolation;
a source region in the same semiconductor fin as the drain region, the source region having a second fin height above the trench isolation;
a drain extension region in the same semiconductor fin as the source region and the drain region, the drain extension region having the first fin height above the trench isolation;
a gate extending across the semiconductor fin; and
a channel region under the gate in the same semiconductor fin as the source region and the drain region, the channel region positioned between the drain extension region and the source region, the channel region having the second fin height above the trench isolation.

2. The LDMOS FinFET of claim 1, wherein the first fin height is between 40% and 60% of the second fin height.

3. The LDMOS FinFET of claim 1, wherein the drain extension region is in an n- well in the semiconductor fin, and the channel region is in a p-well in the semiconductor fin.

4. The LDMOS FinFET of claim 3, wherein a transition between the first fin height and the second fin height is positioned in a gap between the p-well and the n-well in the semiconductor fin.

5. The LDMOS FinFET of claim 1, wherein the gate includes a work function metal layer and a gate conductor over the work function metal layer.

6. A laterally diffused metal-oxide semiconductor (LDMOS) fin-type field effect transistor (FinFET), comprising:
a semiconductor fin having a trench isolation adjacent thereto;
a drain region in the semiconductor fin, the drain region having a first fin height above the trench isolation;
a source region in the same semiconductor fin as the drain region, the source region having a second fin height above the trench isolation;
a drain extension region in the same semiconductor fin as the source region and the drain region, the drain extension region having the first fin height above the trench isolation;
a gate extending across the semiconductor fin; and
a channel region under the gate in the same semiconductor fin as the source region and the drain region, the channel region positioned between the drain extension region and the source region, the channel region having the second fin height above the trench isolation,
wherein the first fin height is less than the second fin height.

7. The LDMOS FinFET of claim 6, wherein the first fin height is between 40% and 60% of the second fin height.

8. The LDMOS FinFET of claim 6, wherein the drain extension region is in an n-well in the semiconductor fin, and the channel region is in a p-well in the semiconductor fin.

9. The LDMOS FinFET of claim 8, wherein a transition between the first fin height and the second fin height is positioned in a gap between the p-well and the n-well in the semiconductor fin.

10. The LDMOS FinFET of claim 8, wherein the p-well includes a p-type dopant, and the n-well includes an n-type dopant.

11. The LDMOS FinFET of claim 6, wherein the source region includes a source region epitaxial portion above the trench isolation, and the drain region includes a drain region epitaxial portion above the trench isolation.

12. The LDMOS FinFET of claim 11, wherein the source region epitaxial region is wider than the drain region epitaxial portion.

13. The LDMOS FinFET of claim 6, wherein the trench isolation is higher relative to a bottom of the semiconductor fin in the drain region than in the source region.

14. The LDMOS FinFET of claim 6, wherein the drain region includes a first drain region epitaxial portion above the trench isolation and a second drain region epitaxial portion below an upper surface of the trench isolation.

15. The LDMOS FinFET of claim 6, wherein the trench isolation is a shallow trench isolation (STI).

* * * * *